(12) United States Patent
Oota

(10) Patent No.: US 8,632,139 B2
(45) Date of Patent: Jan. 21, 2014

(54) ELECTRIC CONTROL DEVICE

(75) Inventor: Shinsuke Oota, Kariya (JP)

(73) Assignee: Denso Corporation, Kariya (JP)

( * ) Notice: Subject to any disclaimer, the term of this patent is extended or adjusted under 35 U.S.C. 154(b) by 156 days.

(21) Appl. No.: 13/202,848

(22) PCT Filed: Sep. 27, 2010

(86) PCT No.: PCT/JP2010/005783
§ 371 (c)(1),
(2), (4) Date: Aug. 23, 2011

(87) PCT Pub. No.: WO2011/045899
PCT Pub. Date: Apr. 21, 2011

(65) Prior Publication Data
US 2011/0304248 A1    Dec. 15, 2011

(30) Foreign Application Priority Data

Oct. 15, 2009   (JP) .................................. 2009-238435
Sep. 2, 2010    (JP) .................................. 2010-196751

(51) Int. Cl.
*A47B 81/00*  (2006.01)

(52) U.S. Cl.
USPC ........................................ 312/223.1; 312/100

(58) Field of Classification Search
USPC ....................... 312/229, 100, 352, 296, 223.1
See application file for complete search history.

(56) References Cited

U.S. PATENT DOCUMENTS

| | | | | |
|---|---|---|---|---|
| 3,951,490 A * | 4/1976 | Devendorf | ....................... | 174/59 |
| 5,531,345 A * | 7/1996 | Nakamura et al. | ............. | 220/3.8 |
| 6,629,619 B2 * | 10/2003 | Sato et al. | .................... | 220/4.02 |
| 6,707,678 B2 * | 3/2004 | Kobayashi et al. | ........... | 361/752 |
| 6,757,155 B2 * | 6/2004 | Koike et al. | .................... | 361/752 |
| 6,982,379 B2 * | 1/2006 | Saka et al. | ....................... | 174/50 |
| 7,561,435 B2 * | 7/2009 | Kamoshida et al. | .......... | 361/752 |
| 7,570,496 B2 * | 8/2009 | Chen et al. | ..................... | 361/818 |
| 8,139,376 B2 * | 3/2012 | Sanroma et al. | ............. | 361/818 |
| 2006/0171127 A1 * | 8/2006 | Kadoya et al. | ................ | 361/752 |

(Continued)

FOREIGN PATENT DOCUMENTS

| | | |
|---|---|---|
| JP | 10-14059 | 1/1998 |
| JP | 2000-247277 | 9/2000 |

(Continued)

OTHER PUBLICATIONS

Japanese Official Action dated Feb. 17, 2012 issued in corresponding Japanese Application No. 2010-196751, with English translation.

(Continued)

*Primary Examiner* — Hanh V Tran
(74) *Attorney, Agent, or Firm* — Nixon Vanderhye P.C.

(57) ABSTRACT

An electronic control device includes: an accommodation element; a cover element; a connection element for fixing the cover element to the accommodation element; an extending protrusion extending and protruding to an outside from a contact portion between the cover element and the accommodation element; and a control element formed in the accommodation space. The extending protrusion includes a protrusion portion, which protrudes toward a bottom side or a cover element side and is formed to cover the contact portion. A clearance having predetermined dimensions is formed between the protrusion portion and one of an outer wall of the cover element and an outer wall of the accommodation element, which is near the contact portion.

7 Claims, 15 Drawing Sheets

(56) References Cited

U.S. PATENT DOCUMENTS

| | | | |
|---|---|---|---|
| 2007/0134951 A1* | 6/2007 | Inagaki et al. | 439/74 |
| 2007/0215614 A1* | 9/2007 | Matsui | 220/3.2 |
| 2007/0230137 A1 | 10/2007 | Inagaki | |
| 2008/0144290 A1* | 6/2008 | Brandt et al. | 361/720 |

FOREIGN PATENT DOCUMENTS

| | | |
|---|---|---|
| JP | 2004-316937 | 11/2004 |
| JP | 2004-319849 | 11/2004 |
| JP | 2004-356524 | 12/2004 |
| JP | 2006-253262 | 9/2006 |
| JP | 2009-207228 A | 9/2009 |
| WO | WO 2005034589 A2 * | 4/2005 |

OTHER PUBLICATIONS

Office Action (3 pages) dated Jan. 24, 2013, issued in corresponding Korean Application No. 10-2011-7029466 and English translation (3 pages).

International Search Report and Written Opinion of PCT/JP2010/005783, mailed Nov. 9, 2010.

International Search Report and Written Opinion of PCT/JP2010/005782, mailed Nov. 9, 2010.

Oota, U.S. Appl. No. 13/202,855, filed Aug. 23, 2011.

Japanese Office Action dated Aug. 16, 2012, issued in corresponding Japanese Application No. 2010-196751 with English translation.

Notification of First Office Action issued for Chinese Patent Application No. 201080013101.2, dated Jun. 5, 2013 (with English Translation), 15 pages.

* cited by examiner

US 8,632,139 B2

ELECTRIC CONTROL DEVICE

CROSS REFERENCE TO RELATED APPLICATIONS

This application is the U.S. national phase of International Application No. PCT/JP2010/005783 filed on Sep. 27, 2010, which designated the U.S. and claims priority to Japanese Patent Applications No. 2009-238435 filed on Oct. 15, 2009, and No. 2010-196751 filed on Sep. 2, 2010, the disclosures of each of which are incorporated herein by reference.

TECHNICAL FIELD

The present invention relates to an electric control device.

BACKGROUND ART

Recently, there are many vehicles, each of which mounts an electric power steering system (i.e., EPS) for assisting a driver to operate a steering wheel with using a motor. In this case, an electric control device for controlling the motor is mounted on the vehicle.

The electric control device is mounted, for example, near a column shaft. In this case, liquid such as dew condensation water and wash fluid for a compartment may drop on the electric control device, so that the liquid penetrates into the electric control device via a clearance between a cover element and an accommodation element. Thus, a system of the device may be down. In order to protect the device from wetting with water, it is proposed that a sealing member is filled between a casing as the accommodation element and a cover as the cover element so that the device is sealed (in, for example, JP-A-2007-273807 and corresponding U.S. Patent Application Publication 2007/0230137).

Alternatively, the electric control device may be packed with a water-protected sheet.

However, each of a method for filling with the sealing member and a method for packing with the water-protected sheet provides high manufacturing cost, and further, low workability.

DISCLOSURE OF THE INVENTION

In view of the above difficulties, it is an object of the present invention to provide an electric control device having a simple structure and high liquid penetration protecting performance.

According to a first aspect of the present disclosure, an electric control device includes: an accommodation element as a casing having an opening and a bottom; a cover element for covering the opening of the accommodation element so that accommodation space is formed between the cover element and the accommodation element; a connection element for fixing the cover element to the accommodation element; an extending protrusion formed on the cover element or the accommodation element in such a manner that the extending protrusion extends and protrudes to an outside from a contact portion between the cover element and a periphery around the opening; and a control element formed in the accommodation space. The extending protrusion includes a protrusion portion, which protrudes toward a bottom side or a cover element side and is formed to cover the contact portion. A clearance having predetermined dimensions is formed between the protrusion portion and one of an outer wall of the cover element and an outer wall of the accommodation element, which is near the contact portion. Thus, the liquid is restricted from penetrating to an inside of the accommodation element via the clearance between the cover element and the periphery of the accommodation element around the opening.

BRIEF DESCRIPTION OF THE DRAWINGS

The above and other aspects, features and advantages of the present invention will become more apparent from the following detailed description made with reference to the accompanying drawings. In the drawings.

PREFERRED EMBODIMENTS FOR CARRYING OUT THE INVENTION

First Embodiment

An electric control device according to the present embodiment is shown in FIGS. 1 to 6. The electric control device according to the present embodiment is suitably used for a EPS of a vehicle, for example. Based on a steering torque signal and a vehicle speed signal, the device controls and drives a motor for generating an assist force of a steering wheel.

Figure 1:
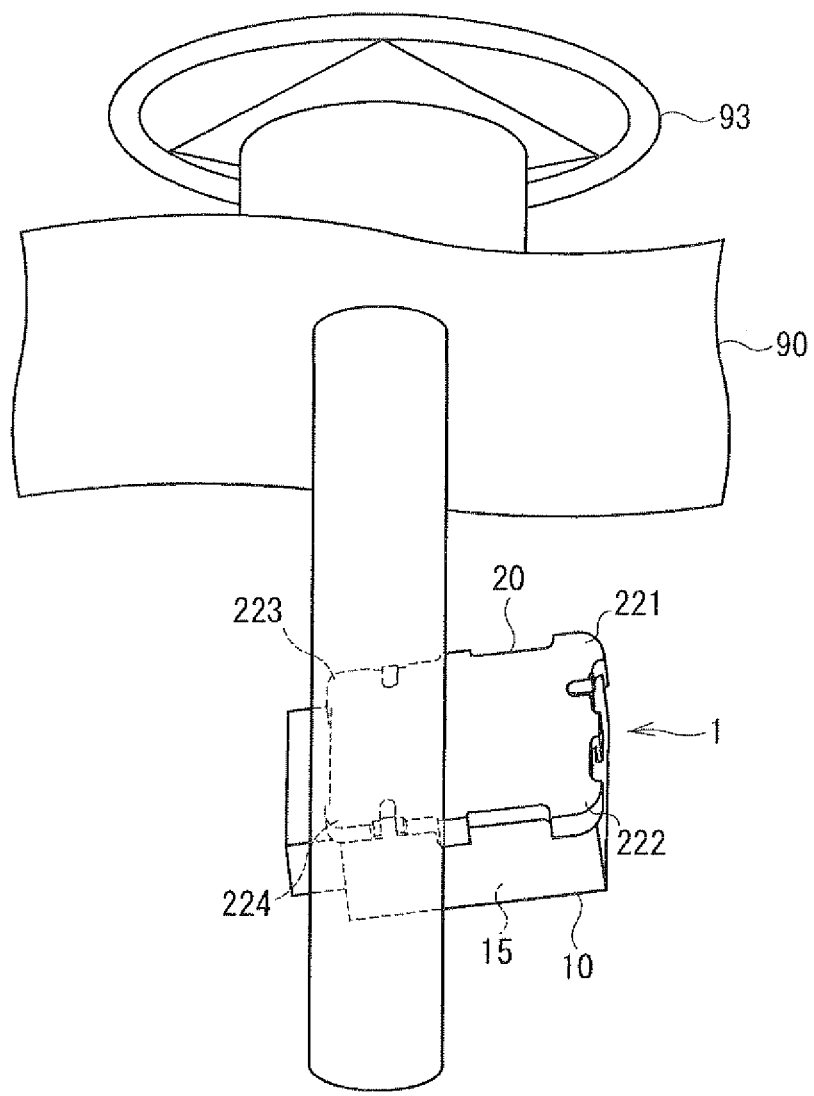
FIG. 1 is a schematic view showing a mounting state of an electric control device according to a first embodiment.

As shown in FIG. 1, the electric control device 1 is disposed on a lower side of the column 91, which is coupled with a steering wheel 92. The electric control device 1 has a substantially rectangular shape. The device 1 is arranged such that four sides of the device 1 is slant with respect to a surface perpendicular to the vertical direction.

Figure 2:
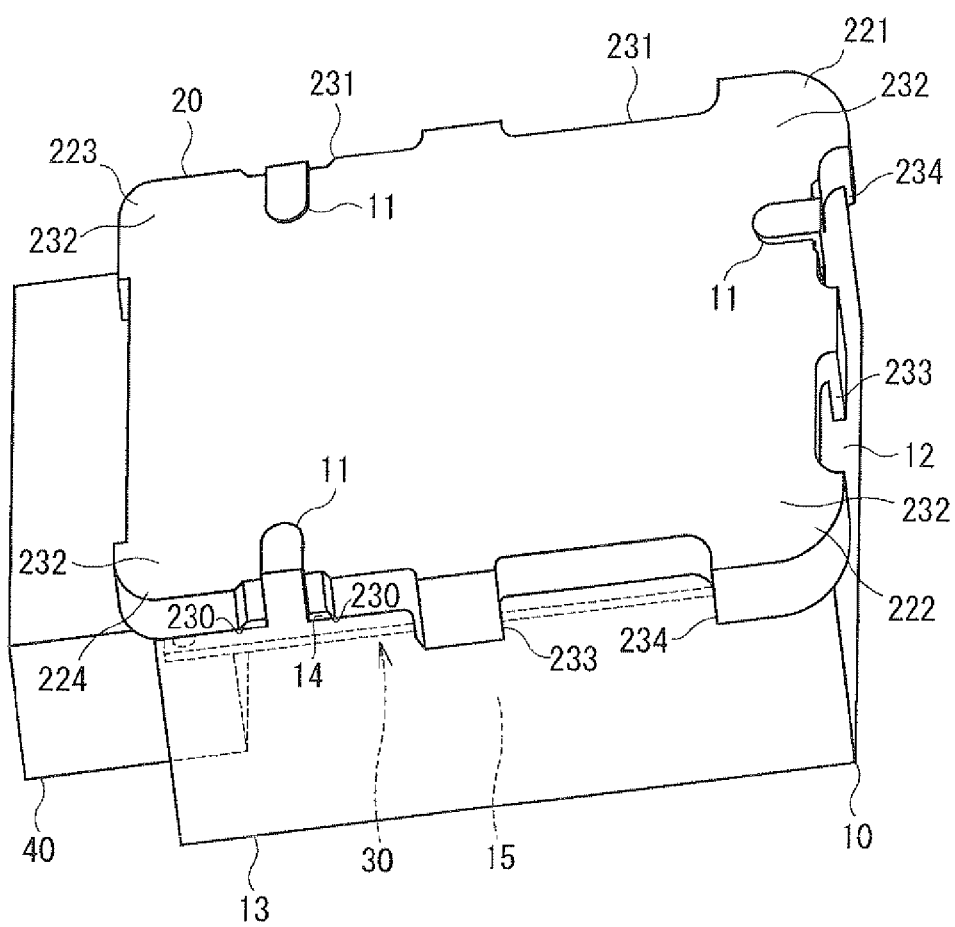
FIG. 2 is a perspective view showing the electric control device according to the first embodiment.

As shown in FIG. 2, the electric control device 1 includes an accommodation element 10, a cover element 20, a hook 11 and a control element 30.

The accommodation element 10 is made of metal such as zinc galvanized stainless steel. The accommodation element 10 is a container having a rectangular shape with a bottom 13 and a side wall 12. The side wall 12 includes the hook 11 disposed on a periphery of an opening opposite to the bottom 13. The hook 11 is swaged with respect to the cover element 20 so that the cover element 20 is fixed to the accommodation element 10.

The control element 30 is formed such that an electric element such as a MOS transistor, an aluminum electrolytic capacitor, a coil, a relay and a shunt resistor is mounted on the substrate. The substrate 31 is assembled to a screw assembling portion via the screw at an area where no electric element is disposed so that the substrate 30 is fixed to the cover element 20.

Figure 3:
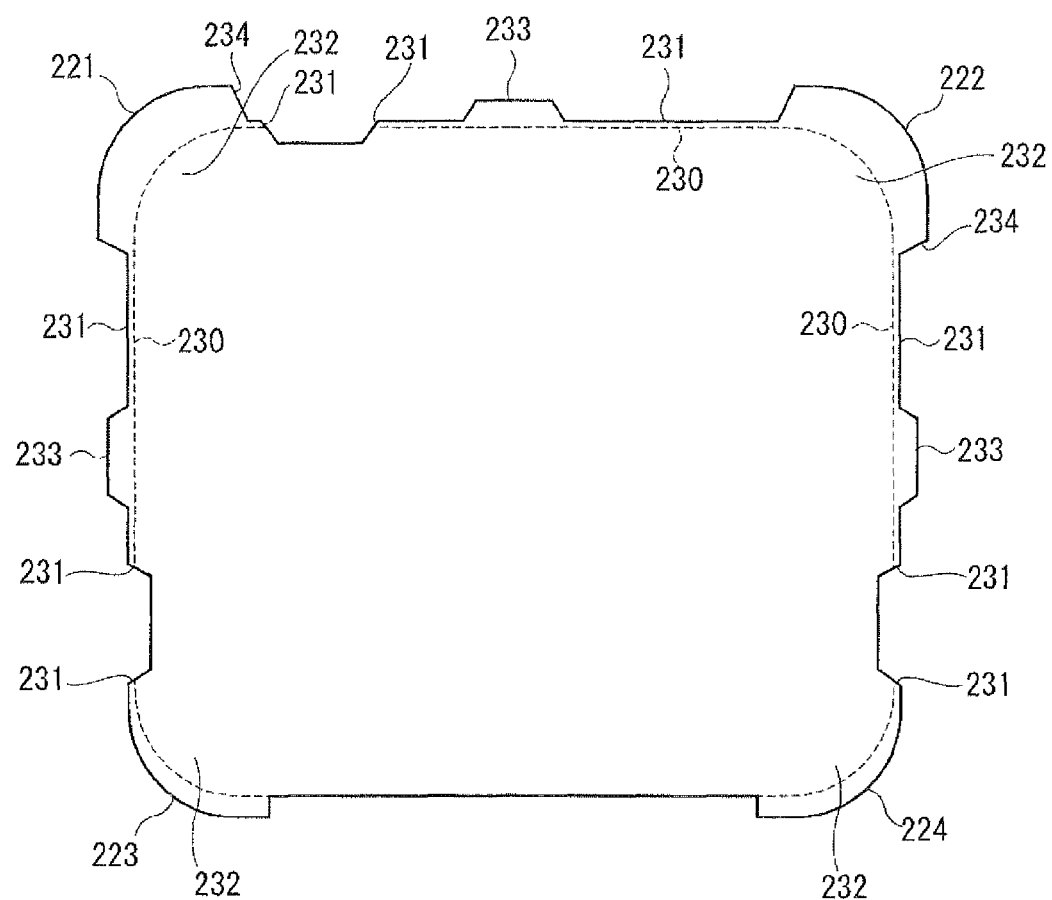
FIG. 3 is a plan view showing a surface of a cover element of the electric control device according to the first embodiment.
Figure 4:
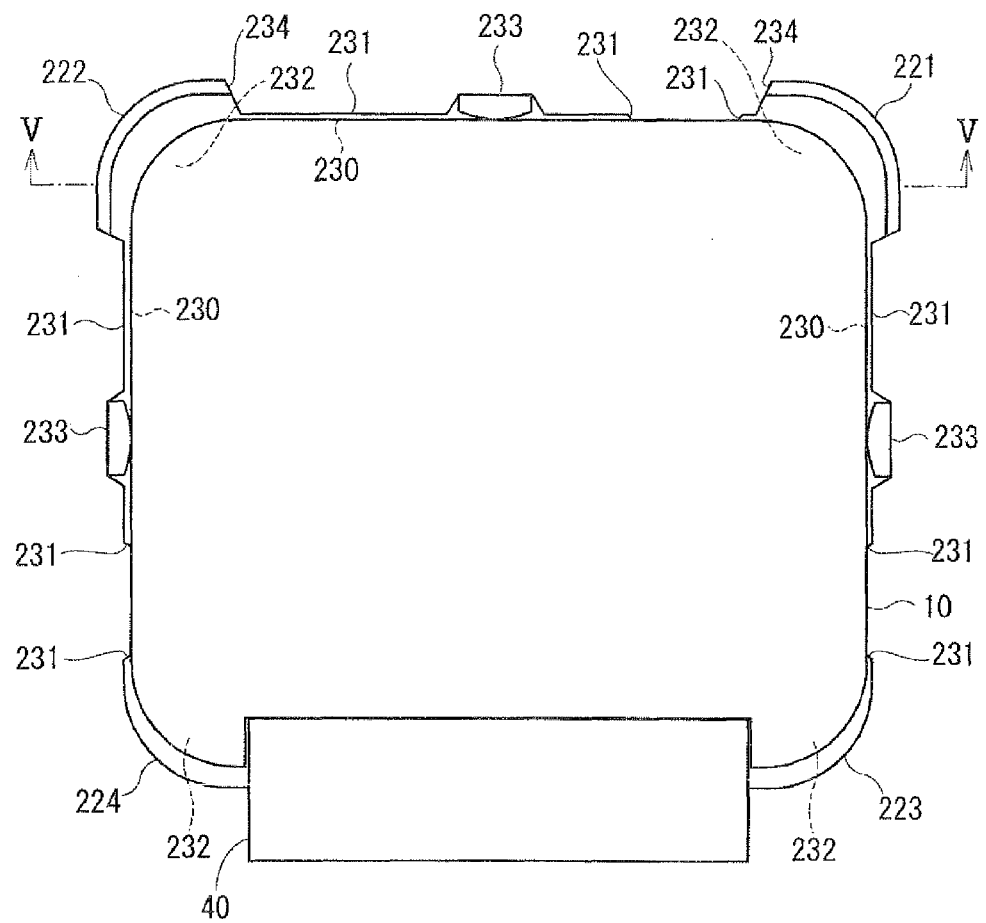
FIG. 4 is a plan view showing the electric control device on an accommodation element side according to the first embodiment.
Figure 5:
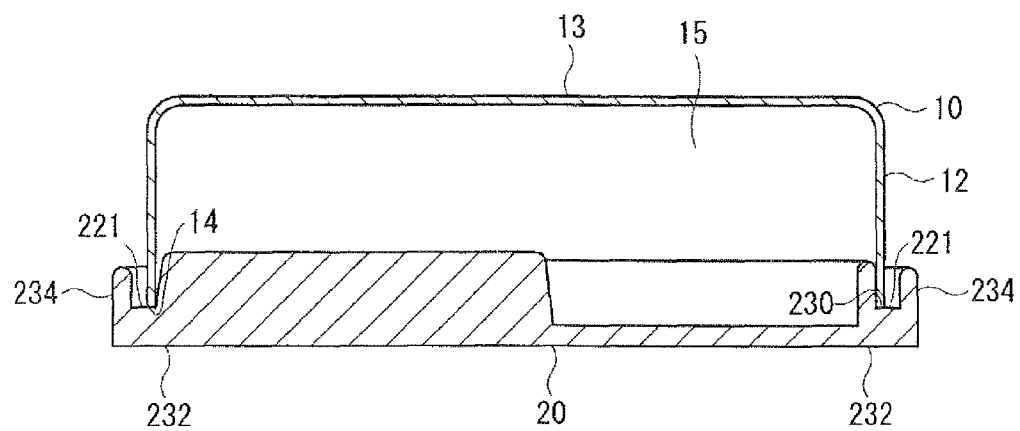
FIG. 5 is a cross sectional view of the electric control device taken along line V-V in FIG. 4.
Figure 6:
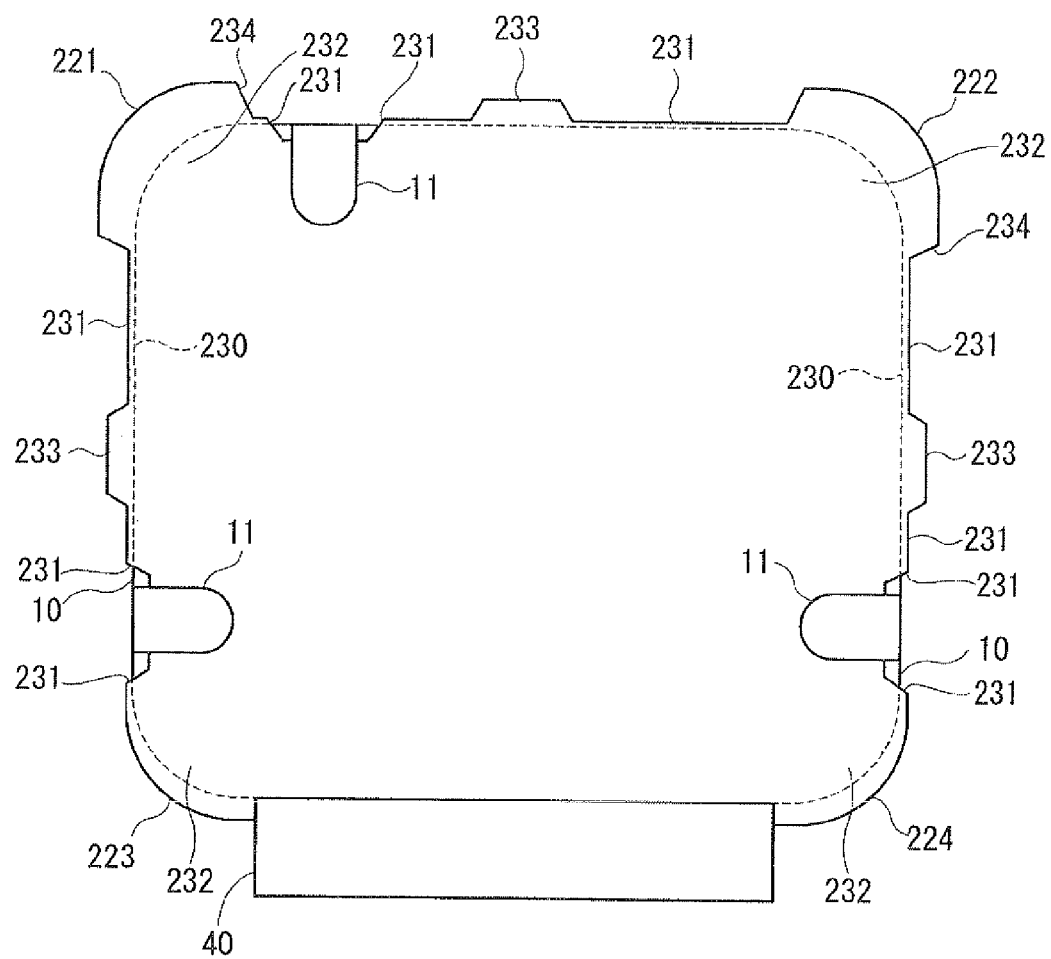
FIG. 6 is a plan view showing the electric control device on the cover element side according to the first embodiment.

As shown in FIGS. 2, 3 and 4, the cover element 20 has a rectangular plate shape, and is made of metal such as aluminum. Since the electric control device 1 is arranged to be slant with respect to the vertical direction, one corner 232 among four corners 232 of the cover element 20 is disposed on the most upper position in the vertical direction. A diagonal corner 232 of the one corner 232 is disposed on the most lower position.

The cover element 20 closes the opening of the accommodation element 10, so that accommodation space 15 for accommodating the control element 30 is formed. Here, a surface of the cover element 20 on the accommodation element 10 side is defined as a back surface. A surface of the cover element 20 opposite to the back surface is defined as a front surface.

The cover element 20 includes a contact portion 230 on the back surface, which contacts a periphery surface of the periphery around the opening of the accommodation element 10. A position nearer a center of the cover element 20 than the contact portion 230 is defined as an "inside." A position further from the center than the contact portion 230 is defined as an "outside."

As shown in FIG. 4, the cover element 20 includes first extending protrusions 221, 222, 223, 224 as an extending protrusion extending toward the outside from the contact portion 230 in a surface direction including the surface. The first extending protrusions 221, 222, 223, 224 are formed to face corners 232 of the outer periphery. Further, the cover element 20 includes a second extending protrusion 231 as an extending protrusion, which is formed to face a side coupling between two corners 232 of the outer periphery. Here, the first extending protrusions 221, 222, 223, 224 are formed to protrude to the outside from the second extending protrusion 231.

A hook shaped fixation member 233 is formed on the second extending protrusion 231 such that the member 233 is formed to extend toward the outside from the second extending protrusion 231 and to bend toward the bottom 13 side of the accommodation element 10. The hook shaped fixation member 233 is formed on three sides among four sides of the cover element 20, and fixes the accommodation element 10.

In the present embodiment, the connector 40 is arranged to face one side of the outer periphery of the cover element 20 (which is a portion connecting two adjacent corners 232). The connector 40 is disposed between the first extending protrusion 223 and the first extending protrusion 224. One end of the connector 40 is electrically coupled with the substrate 31, and the other end is exposed to the outside of the accommodation element 10. The connector 40 is coupled with a harness not shown in the drawings.

The first extending protrusions 221, 222 include protrusion portions 234, respectively. The protrusion portion 234 is formed to protrude toward the bottom 13 side of the accommodation element 10 and to cover the contact portion 230. The protrusion portion 234 is formed to bend along with the outer periphery of the corner 232 so as to cover the corner 232. A clearance having predetermined dimensions is formed between the protrusion portion 234 and a part of the outer wall of the accommodation element 10 (i.e., the side wall 12) near the contact portion 230. (Please refer to FIGS. 4 and 5.)

The first extending protrusion 223, 224 extends and protrudes toward the outside from the contact portion 230, similar to the first extending protrusion 221, 222. However, the protrusion portion 234 is not formed on the first extending protrusion 223, 224, which is different from the first extending protrusion 221, 222.

In the present embodiment, the first extending protrusion 221, 222 formed at the corner 232, which is separated from the connector 40, among four corners 232 corresponds to "a first enlarged extending protrusion" in claims. The first extending protrusion 223, 224, which is formed at the corner 232 near the connector 40, among four corners 232 corresponds to "a second enlarged extending protrusion" in claims.

In the present embodiment, the first extending protrusion 223, 224 (i.e., the second enlarged extending protrusion) is formed such that one end of the first extending protrusion 223, 224 on the connector 40 side overlaps with the connector 40.

Further, the first extending protrusion 221, 222 (i.e., the first enlarged extending protrusion) is formed to extend to the outside from the first extending protrusion 223, 224 (i.e., the second enlarged extending protrusion).

Next, effects of the present embodiment will be explained.

In the present embodiment, the cover element 20 includes the first extending protrusions 221, 222, 223, 224 and the second extending protrusion 231, which protrude toward the outside from the contact portion 230 in the surface direction including the surface. Thus, dew condensation water formed on the column 91, water penetrating through the clearance between the dash board 90 and the column 91 and the like are restricted from penetrating to the inside of the accommodation element 10 via the clearance between the cover element 20 and the periphery 14 around the opening of the accommodation element 10.

The first extending protrusions 221, 222, 223, 224 formed to face the corners 232 of the cover element 20 extend and protrude to the outside from the second extending protrusion 231 formed to face the side of the cover element 20. Thus, the water and the like are effectively restricted from penetrating to the inside of the accommodation element 10 via the clearance near the corner 232 between the cover element 20 and the periphery 14 around the opening of the accommodation element 10.

Further, the protrusion portion 234 protrudes so as to cover the corner 232 and is formed on the back surface of the first extending protrusion 221, 222. Further, A clearance having predetermined dimensions is formed between the protrusion portion 234 and the outer wall of the accommodation element 10 (i.e., the side wall 12) near the contact portion 230. In the present embodiment, the electric control device 1 is arranged such that the first extending protrusion 221, 222 is disposed at a position higher than the first extending protrusion 223, 224.

Accordingly, even if the water drops near the first extending protrusion 221, 222, the water flows along with the protrusion portion 234 to a lower side in the vertical direction. Thus, the water is restricted from penetrating to the inside of the accommodation element 10 via the contact portion 230 near the first extending protrusion 221, 222.

Second Embodiment

Figure 7:
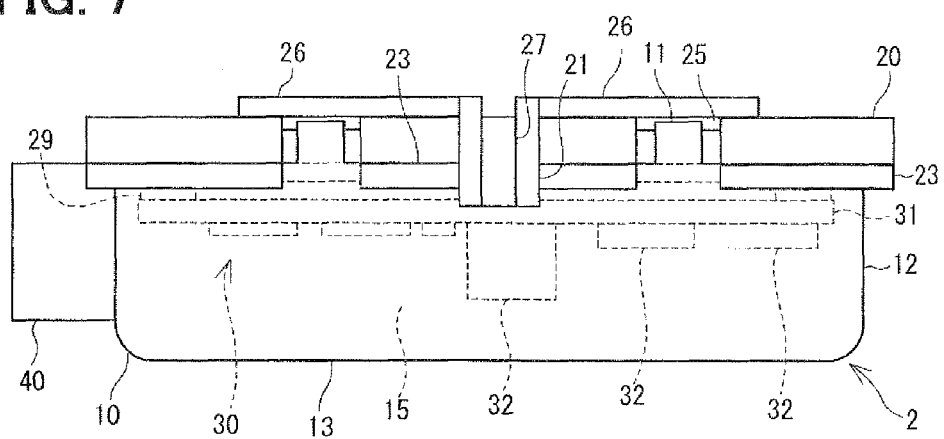
FIG. 7 is a perspective view showing a main part of an electric control device according to a second embodiment.
Figure 8:
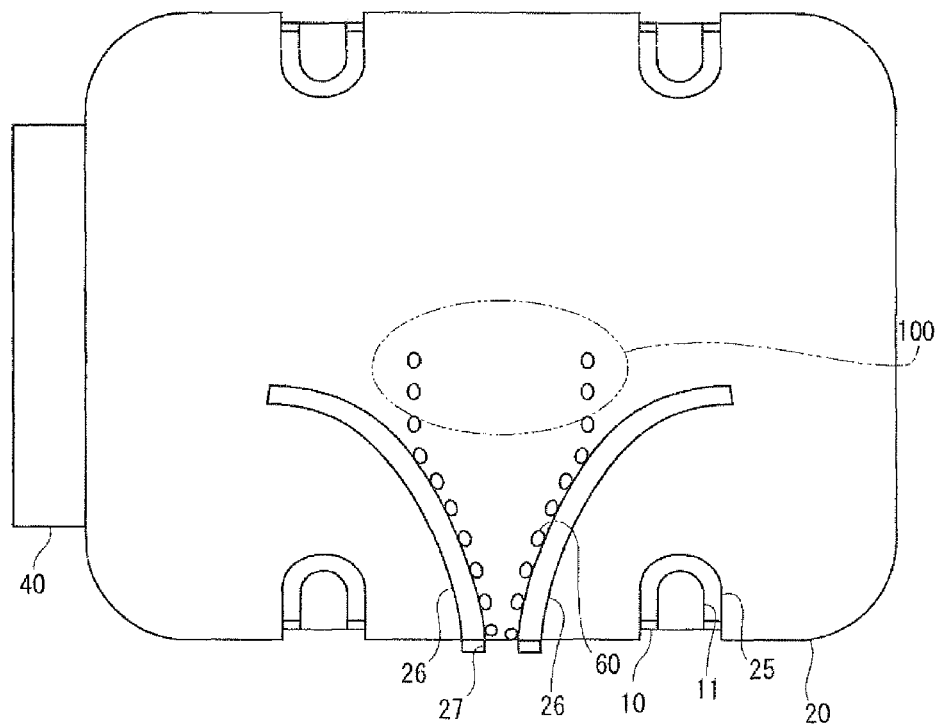
FIG. 8 is a side view of the electric control device according to the second embodiment.
Figure 9A:
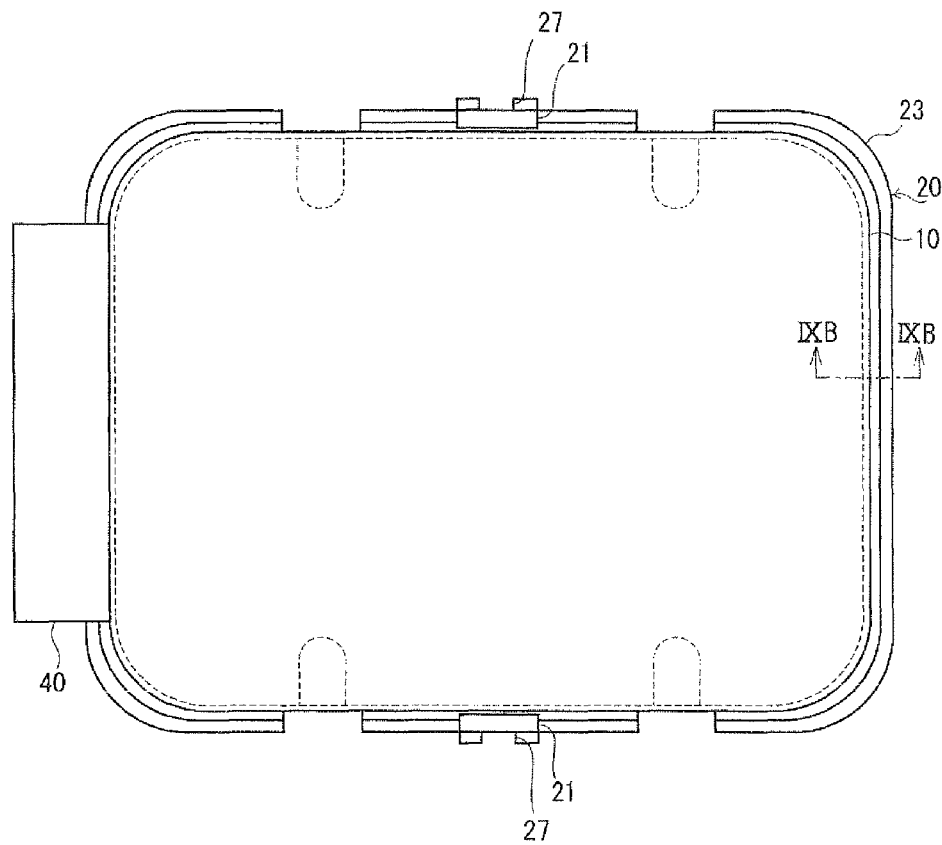
FIG. 9A is a plan view of the electric control device on the accommodation element side.

FIGS. 7, 8 and 9 show an electric control device according to the present embodiment. Substantially the same feature as the above embodiment has the same reference numeral, and the explanation of the feature is skipped.

As shown in FIG. 7, in the present embodiment, two of four hooks 11 are symmetric with each other. The hook engagement member 25 is formed on the surface of the cover element 20. When the hook engagement member 25 and the hook 11 of the accommodation element 10 are engaged with each other, so that the cover element 20 is fixed to the accommodation element 10.

As shown in FIG. 7, the hook engagement member 25 is formed on the surface of the cover element 20. When the hook engagement member 255 and the hook 11 of the accommodation element 10 are engaged with each other, the cover element 20 is fixed to the accommodation element 10. Further, the accommodation element fixation hook 21 is disposed on the back surface of the cover element 20. The accommodation element fixation hook 21 extends along with the outer wall of the accommodation element 10 from the cover element 20. The accommodation element fixation hook 21 is formed to steps over the clearance between the cover element 20 and the accommodation element 10. The accommodation element 10 is fixed to the cover element 20 with using the accommodation element fixation hook 21 so as not to move the accommodation element 10 to the back surface direction of the cover element 20.

Multiple hook engagement members 25 are formed on the front surface of the cover element 20. As shown in FIG. 8, a liquid drop area 100 is disposed on the front surface of the cover element 20. The liquid drop area 100 is an area as a drop position, at which the liquid such as dew condensation water is estimated to be dropped when the electric control device according to the present embodiment is mounted in a vehicle. For example, when the electric control device 2 according to the present embodiment is arranged under a column shaft, a position, at which the dew condensation water on the column shaft is dropped, is estimated, so that the liquid drop area 50 is determined at the position.

FIG. 8 shows a plan view of the electric control device 2 on the cover element 20 side according to the present embodiment. As shown in FIG. 8, the flowing passage formation portion 26 is formed on the front surface of the cover element 20 in the vertical direction between the liquid drop area 100 and the hook engagement member 25. The flowing passage formation portion 26 is formed separately round the hook engagement member 25. Two flowing passage formation portions 26 are formed to be symmetric with each other with respect to the liquid drop area 100.

As shown in FIG. 8, an introduction groove 27 is formed over the accommodation element fixation hook 21 of the cover element 20 between two flowing passage formation portions 26. The liquid introduced to the periphery of the cover element 20 is dropped along with the introduction groove 27 downwardly.

Figure 9B:
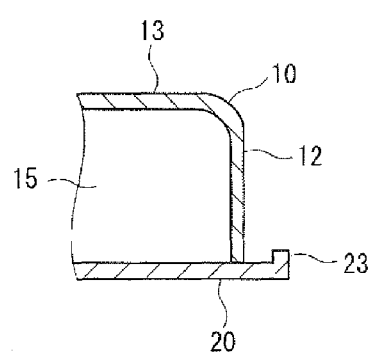
FIG. 9B is a cross sectional view of the electric control device taken along line IXB-IXB.

FIG. 9 shows a plan view of the electric control device 2 on the accommodation element 10 side according to the present embodiment. As shown in FIG. 9, a protrusion wall 23 is disposed on a back surface periphery of the cover element 20. The protrusion wall 23 is formed along with the back surface periphery of the cover element 20 in the vertical direction. For example, it is preferred that the protrusion wall 23 is formed to be in parallel to a sidewall of the accommodation element 10. As shown in FIG. 9B, the protrusion wall 23 extends to the accommodation element 10 side of the clearance between the cover element 20 and the accommodation element 10. For example, it is preferred that a length of the protrusion wall 23 is in a range between 3 millimeters and 5 millimeters.

Further, a screw assembling portion 29, an engagement member 28 and the like are formed on the back surface of the cover element 20. The screw assembling portion 29 is a place where the substrate 31 is fixed with a screw. The engagement member 28 is formed near an inner wall of the accommodation element 10. A clearance is formed between the engagement member 28 and the inner wall of the accommodation element 10 so that the liquid easily flows from the engagement member 28 to the inner wall of the accommodation element 10 via the clearance.

The control element 30 is made of, for example, glass woven fabric and epoxy resin. An electric element 32 such as a MOS transistor, an aluminum electrolytic capacitor, a coil, a relay and a shunt resistor is mounted on the substrate 31. The substrate 31 is assembled to the screw assembling portion 29 via the screw at an area where no electric element 32 is disposed so that the substrate 31 is fixed to the cover element 20.

Next, the effects of the electric control device 2 according to the present embodiment will be explained.

In the present embodiment, the flowing passage formation portion 26 is formed on the front surface of the cover element 20 between the liquid drop area 100 and the hook engagement member 25. The liquid on the liquid drop area 100 is introduced to the periphery of the cover element 20 without reaching the clearance between the hook engagement member 25 and the hook 11. Thus, the liquid is restricted from penetrating to the inside of the electric control device 1 via the clearance between the hook engagement member 25 and the hook 11.

The introduction groove 27 is formed over the accommodation element fixation hook 21 of the cover element 20 between two flowing passage formation portions 26. Thus, the liquid introduced to the periphery of the cover element 20 drops along with the introduction groove 27 downwardly.

Further, the accommodation element fixation hook 21 extends and protrudes from the cover element 20 along with the outer wall of the accommodation element 10 so that the accommodation element fixation hook 21 is formed to step over the clearance between the cover element 20 and the accommodation element 10. Thus, the water flowing in the introduction groove 27 is restricted from penetrating to the inside of the electric control device 2 along with the clearance between the cover element 20 and the accommodation element 10.

The protrusion wall 23 is formed on the periphery of the cover element 20 according to the present embodiment. Thus, the liquid is restricted from penetrating into the clearance between the cover element 20 and the accommodation element 10 by surface tension.

As a result, the above simple structure provides high water proof effect.

Third Embodiment

Figure 10:
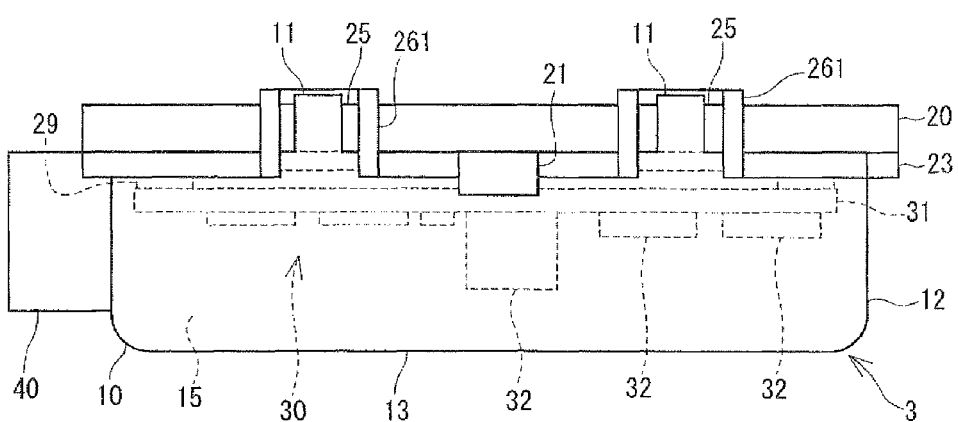
FIG. 10 is a side view of an electric control device according to a third embodiment.
Figure 11:
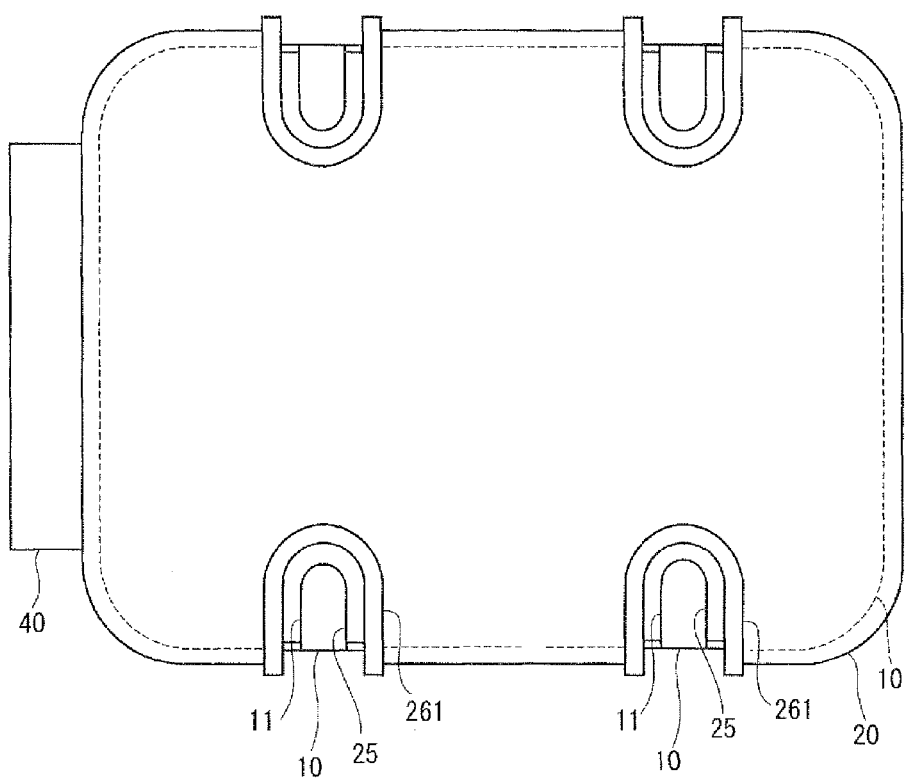
FIG. 11 is a plan view of the electric control device on a cover element side according to the third embodiment.
Figure 12A:
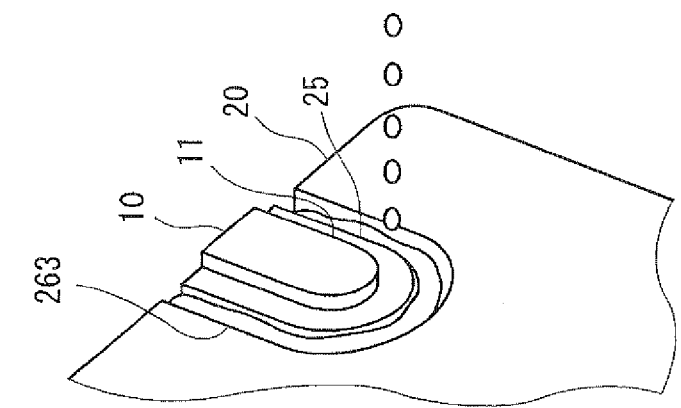
FIG. 12 is a perspective view of a main part of the electric control device according to the third embodiment.

FIGS. 10, 11 and 12 show an electric control device according to the present embodiment. Substantially the same feature as the above embodiment has the same reference numeral, and the explanation of the feature is skipped. As shown in FIGS. 10 and 11, a separation wall 261 is formed on the front surface of the cover element 20 along with the outline of the hook engagement member 25. It is preferred that the separation wall 261 completely surrounds the hook 11, which is exposed on the front surface of the cover element 20. As shown in FIG. 10, it is preferred that the separation wall 261 is formed to reach the end of the protrusion wall 23 from the front surface to the back surface of the cover element 20.

Figure 12B:
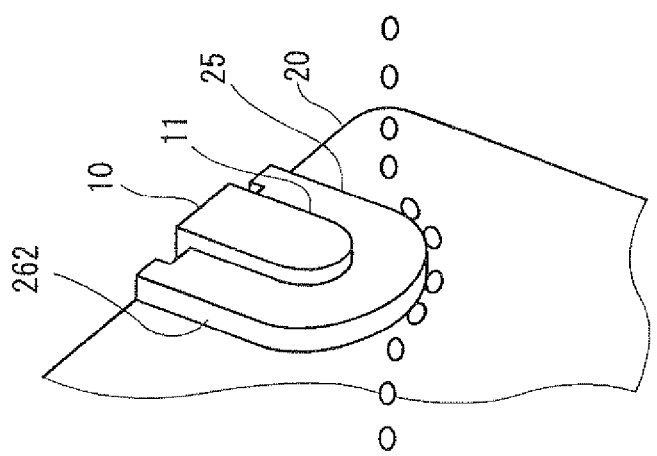
Figure 12C:
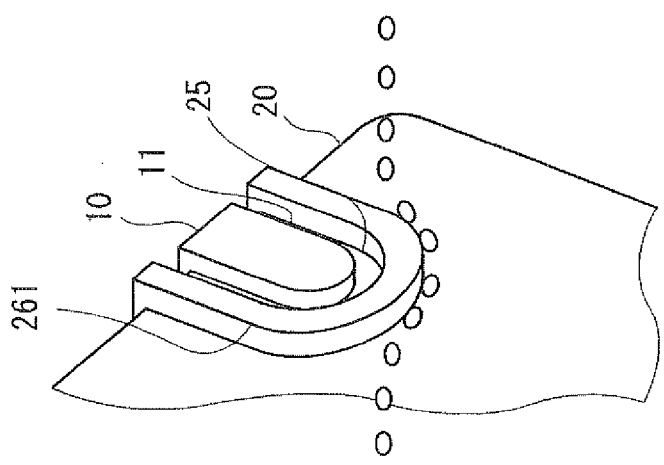

As shown in FIG. 12B, according to a modification of the present embodiment, a separation board 262 integrated with the hook engagement member 25 may be formed. Alternatively, as shown in FIG. 12C, a separation groove 263 instead of the separation wall 261 may be formed.

When the separation member such as the separation wall 261, the separation board 262 and the separation groove 263 is formed in the electric control device 3 according to the present embodiment, the liquid is restricted from penetrating to the inside of the electric control device 2 via the clearance between the hook engagement member 25 and the hook 11. Thus, the simple structure provides high water proof effect.

Fourth Embodiment

Figure 13:
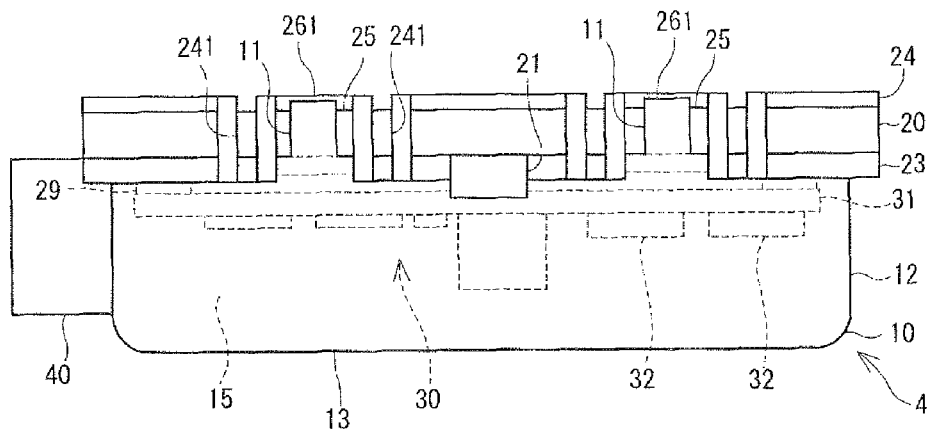
FIG. 13 is a side view of an electric control device according to a fourth embodiment.
Figure 14:
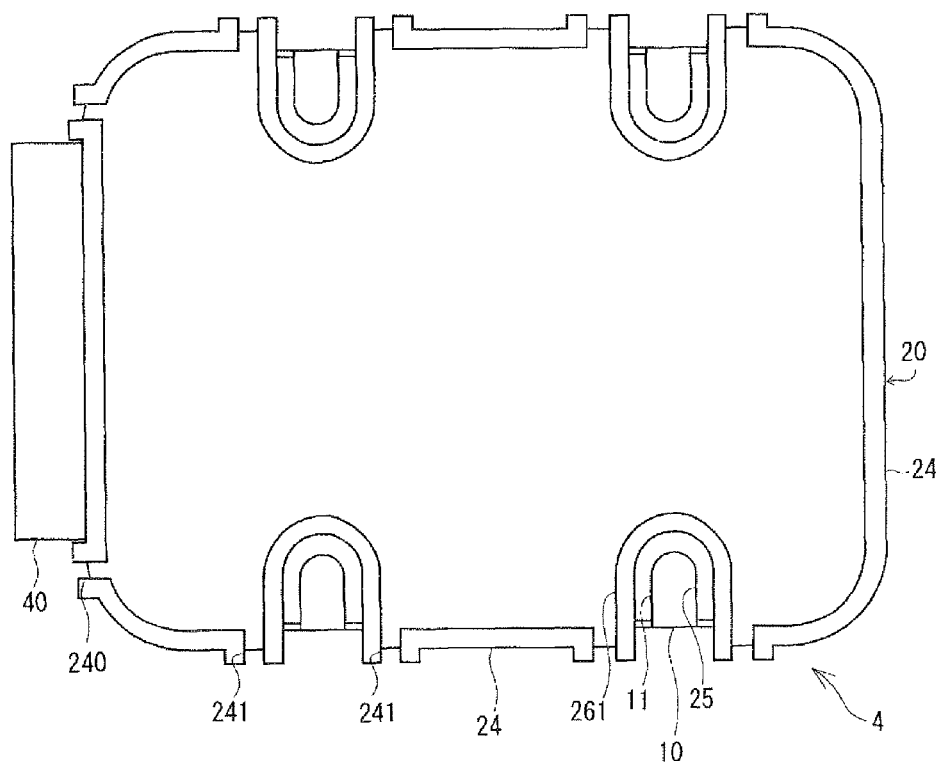
FIG. 14 is a plan view of the electric control device on a cover element side according to the fourth embodiment.

An electric control device according to the present embodiment is shown in FIGS. 13 and 14. Substantially the same feature as the above embodiment has the same reference numeral, and the explanation of the feature is skipped. As shown in FIGS. 13 and 14, a separation periphery wall 24 disposed along with the periphery of the cover element 20 in the electric control device 4 protrudes from the front surface of the cover element 20 in a direction perpendicular to the surface of the cover element 20. Further, a drain trench 241 is formed between the separation periphery wall 24 and the separation wall 261. It is preferred that the drain trench 241 is arranged at a position, which does not affect other elements. As shown in FIG. 14, a drain trench 240 is also formed on both sides of the connector 40.

Since the separation periphery wall 24 is formed on the front surface of the cover element 20 in the electric control device 4 according to the present embodiment, the liquid on the liquid drop area 100 is restricted from penetrating into the clearance between the cover element 20 and the accommodation element 10. Specifically, the liquid is restricted from penetrating into the clearance between the cover element 20 and the connector 40.

Further, since the device 3 includes multiple drain trenches 241, the electric control device 3 can be slant toward any drain trench 241 side. Thus, the degree of freedom of arrangement of the electric control device 4 increases. The device 4 can be arranged without affecting other elements with dropped liquid.

Further, since the liquid is introduced and discharged through the drain trenches 240 on both sides of the connector 40 so that the liquid is restricted from penetrating into the clearance between the connector 40 and the accommodation element 10. Thus, the simple structure provides high water proof effect.

Fifth Embodiment

Figure 15:
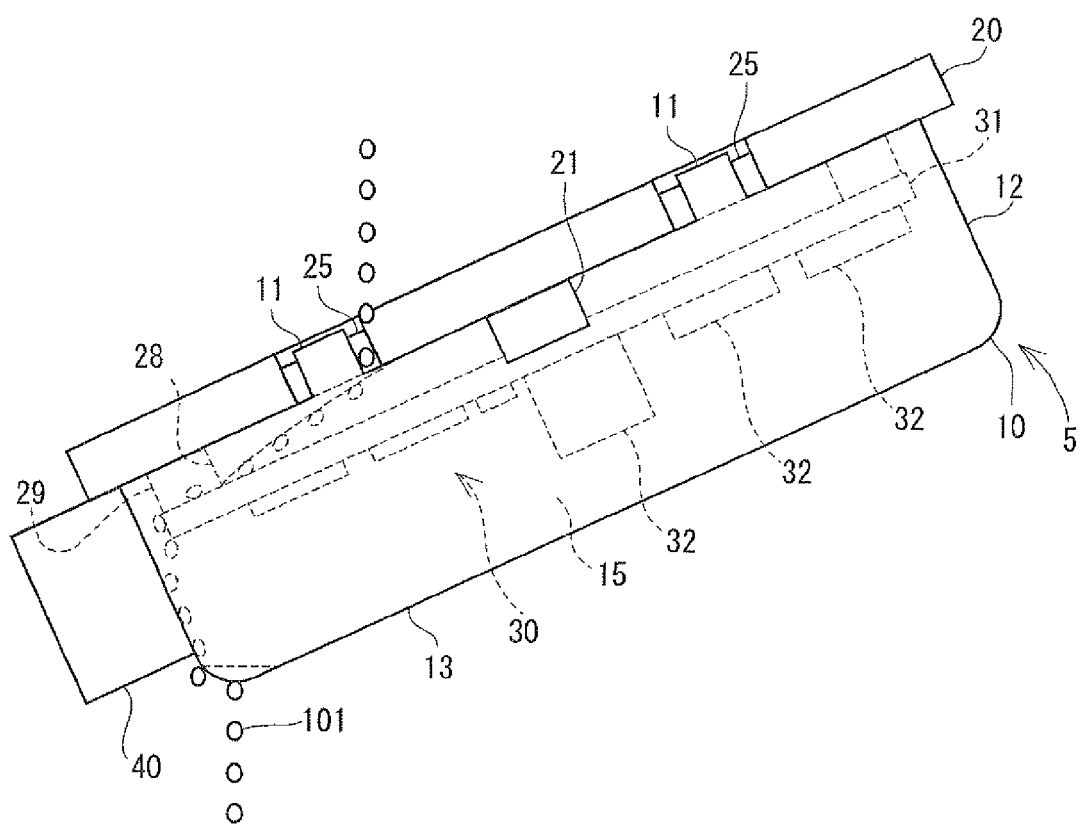
FIG. 15 is a side view of an electric control device according to a fifth embodiment.

An electric control device according to the present embodiment is shown in FIG. 15. Substantially the same feature as the above embodiment has the same reference numeral, and the explanation of the feature is skipped. As shown in FIG. 15, the engagement member 28 is formed to have a taper shape for introducing the liquid to a predetermined area. Specifically, the engagement member 28 is formed to have the taper shape such that a thickness of the engagement member 28 on the screw assembling member 29 side in the direction perpendicular to the back surface is larger than that on the hook engagement member 25 side.

When the engagement member 28 formed on the back surface of the cover element 20 in the electric control device 5 according to the present embodiment has the taper shape, the liquid penetrated into the electric control device 4 can be introduced to a predetermined area, in which no electric element is disposed. As shown in FIG. 15, the liquid penetrated through the clearance between the hook engagement member 25 and the hook 11 is introduced to the screw assembling member 29 by the engagement member 28 having the introducing shape. Then, the liquid drops from the area, in which no electric element 32 is arranged. Thus, even if the liquid enters into the electric control device 4 via the clearance between the hook engagement member 25 and the hook 11, the electric control device 31 is protected from wetting with water. Thus, the simple structure provides high water proof effect.

Sixth Embodiment

Figure 16A:
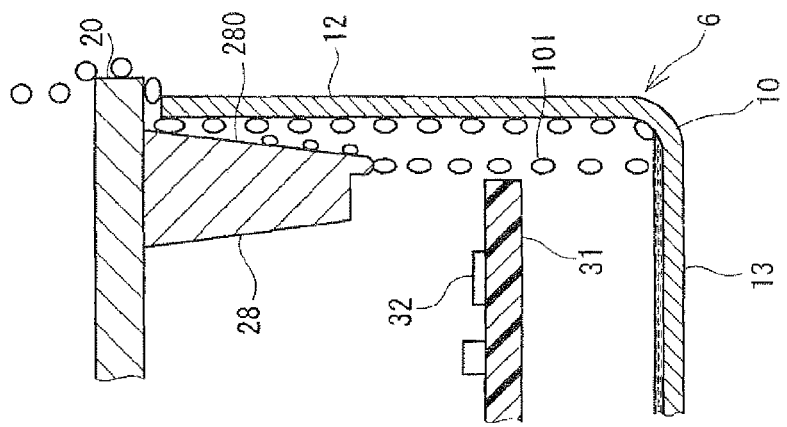
FIGS. 16A to 16C are cross sectional views of a main part of an electric control device according to a sixth embodiment.
Figure 16B:
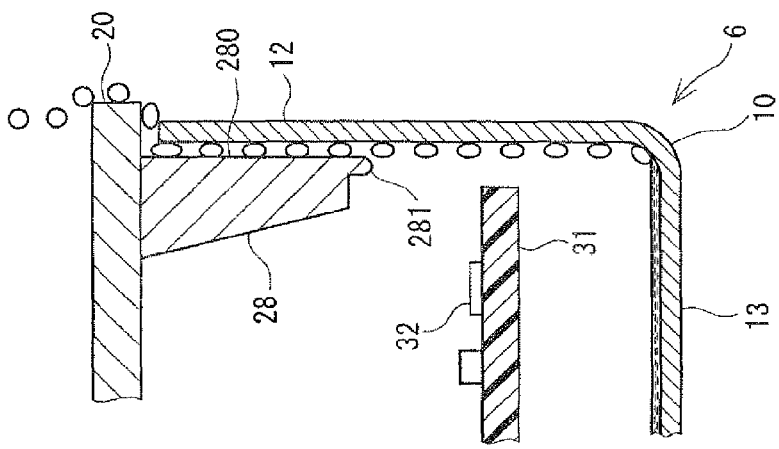

An electric control device according to the present embodiment is shown in FIG. 16. Substantially the same feature as the above embodiment has the same reference numeral, and the explanation of the feature is skipped. As shown in FIGS. 16A and 16B, the engagement member 28 includes an outer wall 280, which is formed nearer the side inner wall surface of the accommodation element 10 than the periphery of the substrate 31. In this case, it is preferred that the outer wall 280 has a clearance so that the liquid easily flows from the outer wall 280 of the engagement member 28 to the side inner wall surface of the accommodation element 10 by surface tension. It is preferred that the outer wall 280 is formed to be in parallel to the side inner wall surface of the accommodation element 10. Alternatively, the side inner wall surface of the accommodation element 10 may be formed to be in parallel to the outer wall 280 of the engagement member 28.

Figure 16C:
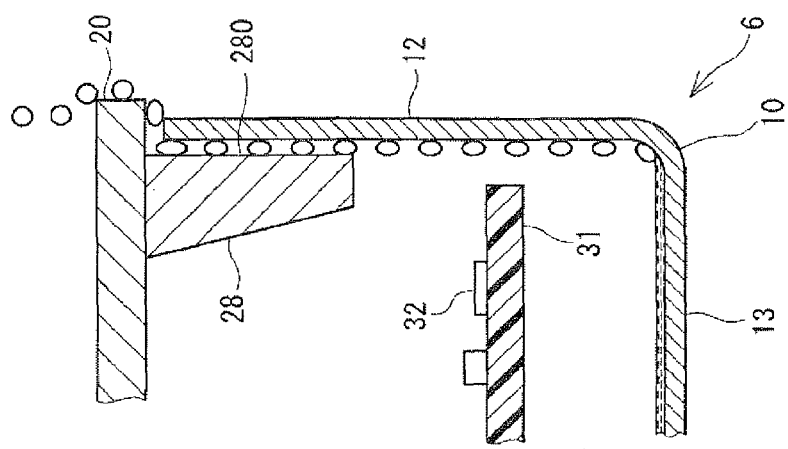

As shown in FIGS. 16B and 16C, a convexity 281 may be formed at one end of the engagement member 28 on the substrate 30 side and on the side inner wall side of the accommodation element 10. It is preferred that the convexity 281 is formed to be nearer the side inner wall of the accommodation element 10 than the periphery of the substrate 30. The convexity 281 may be formed as a protrusion wall, which is disposed continuously along with the engagement member 28. Alternatively, the convexity 281 may be formed discretely.

Since the engagement member 28 of the electric control device 6 according to the present embodiment includes the outer wall 280, which is formed to be nearer the side inner wall surface of the accommodation element 10 than the periphery portion of the substrate 30, the liquid penetrating through the clearance between the accommodation element 10 and the cover element 20 is introduced so as to flow along with the inner wall of the accommodation element 10.

Further, since the convexity 281 is formed on the engagement member 28, the liquid is restricted from crossing over the engagement member 28 and reaching the substrate 31. Accordingly, the liquid is restricted from dropping on the substrate 31. The simple structure provides high water proof effect.

Seventh Embodiment

Figure 17A:
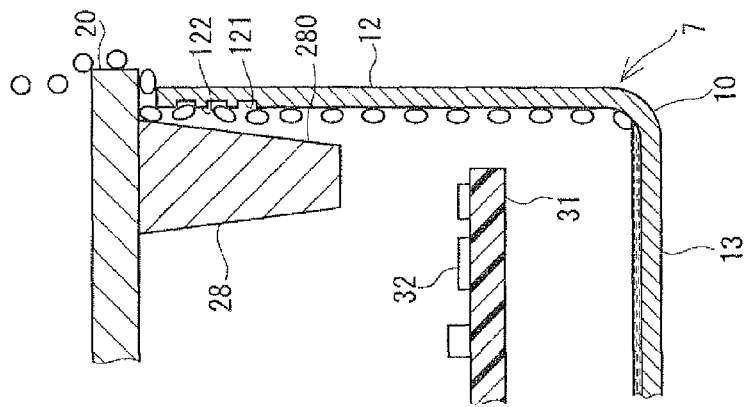
FIGS. 17A to 17C are cross sectional views of a main part of an electric control device according to a seventh embodiment.
Figure 17B:
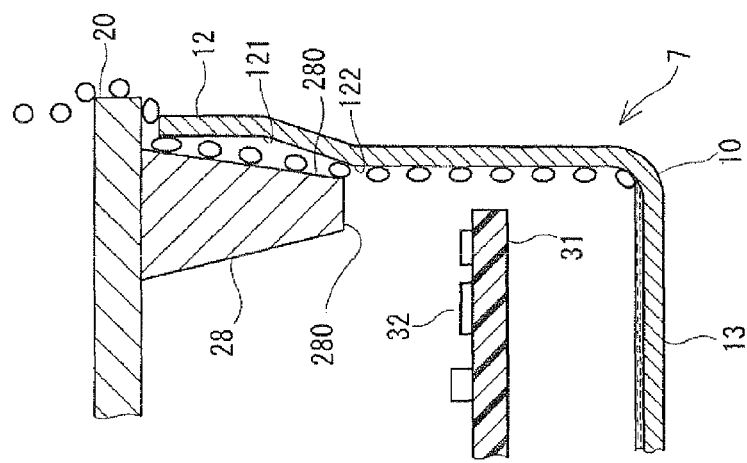
Figure 17C:
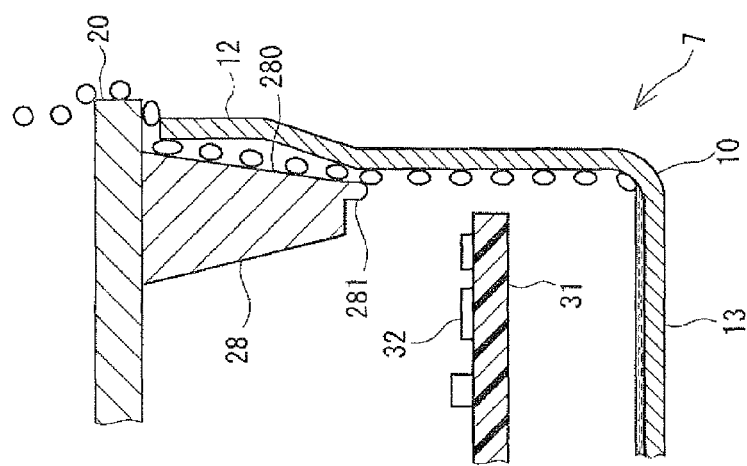

An electric control device according to the present embodiment is shown in FIG. 17. Substantially the same feature as the above embodiment has the same reference numeral, and the explanation of the feature is skipped. As shown in FIG. 17, the accommodation element 10 includes at least one concavity 121 and one convexity 122 disposed on the side inner wall surface near the engagement member 28 of the cover element 20. It is preferred that a clearance for easily flowing the liquid from the outer wall 280 of the engagement member 28 to the side inner wall surface of the accommodation element 10 is formed between the convexity 122 and the engagement member 28. Further, as shown in FIG. 17C, it is preferred that the accommodation element 10 includes multiple concavities 121 and multiple convexities 122. The shape of the concavity 121 and the shape of the convexity 122 may be various shapes as long as the shape provides to increase the surface tension on the side inner wall surface of the accommodation element 10 near the engagement member 28.

Since the accommodation element 10 of the electric control device 7 according to the present embodiment includes at least one concavity 121 and one convexity 122, the liquid penetrating through the clearance between the accommodation element 10 and the cover element 20 is introduced to flow along with the inner wall of the accommodation element 10. Further, since the clearance for easily flow the liquid from the outer wall 280 of the engagement member 28 to the side inner wall surface of the accommodation element 10 is formed between the convexity 122 and the engagement member 28, the liquid flowing on the outer wall 280 of the engagement member 28 easily flows to the side inner wall surface of the accommodation element 10. Further, since multiple concavities 121 and the convexities 122 are formed so that the surface area per unit volume of the side inner wall surface of the accommodation element 10 increases, they promote to flow the liquid along with the inner wall of the accommodation element 10 by surface tension. Thus, the liquid is restricted from reaching the substrate 30. The simple structure provides high water proof effect.

Eighth Embodiment

Figure 18:
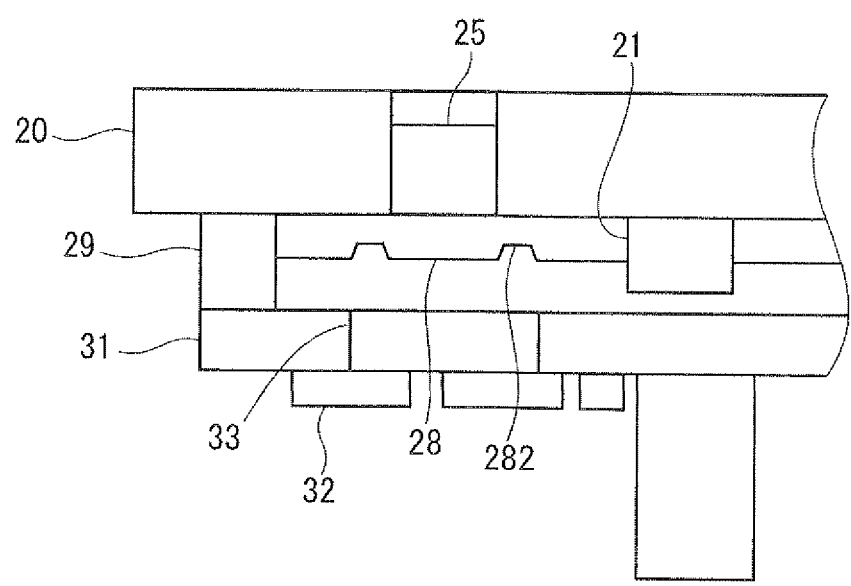
FIG. 18 is a side view of a main part of an electric control device according to a eighth embodiment.
Figure 19:
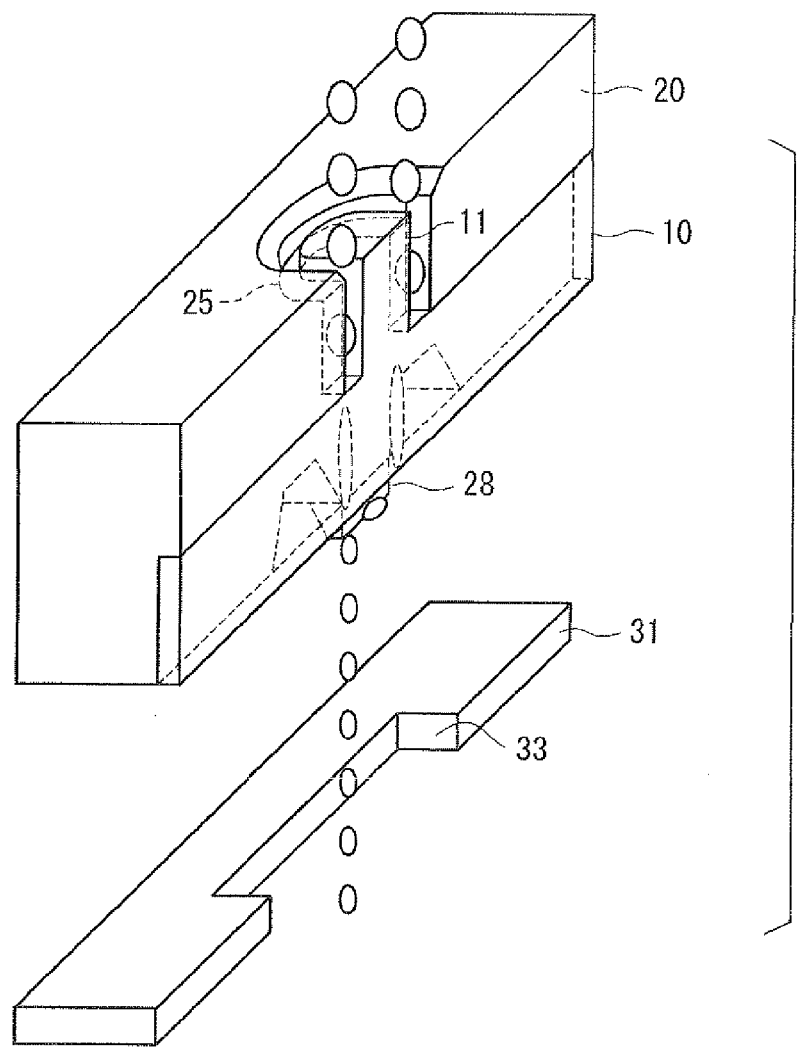
FIG. 19 is a perspective view of the main part of the electric control device according to the eighth embodiment.

An electric control device according to the present embodiment is shown in FIGS. 18 and 19. Substantially the same feature as the above embodiment has the same reference numeral, and the explanation of the feature is skipped. FIG. 18 is a side view showing a part of the electric control device 6 under a condition that the accommodation element 10 and the connector 40 are removed. As shown in FIG. 18, the substrate 31 includes a notch concavity 33. The notch concavity 33 is formed on an area of the substrate 31, which corresponds to the hook engagement member 25. It is preferred that a width of the notch concavity 33 is longer than a width of the hook 11. For example, it is preferred that the notch is formed to have the width in a range between 13 millimeters and 15 millimeters and a depth in a range between 2 millimeters and 3 millimeters.

As shown in FIG. 18, the introduction groove 282 is formed on the engagement member 28. The projection of the introduction groove 282 in the vertical direction is disposed between a projection of the hook 11 in the vertical direction and a projection of the substrate 31 having the notch concavity 33 in the vertical direction. Further, as shown in FIG. 18, it is preferred that the introduction groove 282 is formed in the engagement member 28 between a vertical line passing through one end of the hook 11 and a vertical line passing through one end of the notch concavity 33. Here, the introduction groove 282 corresponds to a "liquid drop introduction member" in claims.

FIG. 19 is a three-dimensional perspective view around the notch concavity 33 of the substrate 31. As shown ion FIG. 19, since the substrate 31 in the electric control device 8 according to the present embodiment includes the notch concavity 33, the liquid penetrating between the hook engagement member 25 and the hook 11 is restricted from dropping on the substrate 31. Thus, the simple structure provides high water proof effect. Further, the introduction groove 282 is formed between a longitudinal direction line passing through the end of the hook 11 and a longitudinal direction line passing through the end of the notch concavity 33, so that the liquid is much restricted form dropping on the substrate 31.

Other Embodiments

In the above embodiments, the electric control device is disposed such that the cover element is arranged on an upper side of the accommodation element in the vertical direction. Further, the liquid drop area is estimated at the surface of the cover element. In other embodiments, the electric control device may be disposed such that the bottom of the accommodation element is arranged on the upper side of the cover element in the vertical direction. Further, the liquid drop area, on which it is estimated that the liquid is dropped, may be estimated at a surface opposite to the accommodation space of the accommodation element. In this case, the extending protrusion (the first and second extending protrusions), the protrusion portion, the extending wall, the separation wall, the flowing passage formation portion, and the separation periphery wall are formed in the accommodation element. The protrusion portion is formed to face the cover element side. Further, the special separation wall is formed on the side wall of the accommodation element along with the outline of the accommodation element fixation hook or the first protrusion portion.

In the above embodiments, two flowing passage formation portions are formed. In other embodiments, three or more flowing passage formation portions may be formed. For example, five flowing passage formation portions surrounding the connector and four hook engagement portions may be formed. In this case, the introduction groove may be formed between the flowing passage formation portions.

In the above embodiments, the engagement member has the taper shape. In other embodiments, the engagement member may be a shaft for connecting between the back surface of the hook engagement member and the screw assembling member. In this case, it is preferred that the engagement member is arranged nearer the control element on the screw assembling member side than the hook engagement member side. Specifically, the engagement member has a shape for introducing the liquid from the hook engagement member side to the screw assembling member side.

In the above embodiments, the introduction concavity is formed in the engagement member. In other embodiments, the introduction convexity instead of the introduction concavity may be formed at the same position.

The above disclosure had the following aspects.

According to a first aspect of the present disclosure, an electric control device includes: an accommodation element as a casing having an opening and a bottom; a cover element for covering the opening of the accommodation element so that accommodation space is formed between the cover element and the accommodation element; a connection element for fixing the cover element to the accommodation element; an extending protrusion formed on the cover element or the accommodation element in such a manner that the extending protrusion extends and protrudes to an outside from a contact portion between the cover element and a periphery around the opening; and a control element formed in the accommodation space. The extending protrusion includes a protrusion portion, which protrudes toward a bottom side or a cover element side and is formed to cover the contact portion. A clearance having predetermined dimensions is formed between the protrusion portion and one of an outer wall of the cover element and an outer wall of the accommodation element, which is near the contact portion. Thus, the liquid is restricted from penetrating to an inside of the accommodation element via the clearance between the cover element and the periphery of the accommodation element around the opening.

Alternatively, the accommodation element and the cover element may be formed to have a rectangular shape. The extending protrusion, the protrusion portion and the clearance are formed to face at least one corner among four corners of the accommodation element or the cover element. Thus, the liquid is restricted from penetrating to the inside of the accommodation element via the corner.

Alternatively, the protrusion portion may be formed to bend along with an outer periphery of the corner so as to cover the corner. Thus, the effect for restricting the liquid from penetrating to the inside of the accommodation element via the corner is much improved.

Alternatively, the accommodation element and the cover element may be formed to have a rectangular shape. The extending protrusion includes a first extending protrusion formed to face a corner of an outer periphery of the accommodation element or the cover element and a second extending protrusion formed to face a side of the outer periphery of the accommodation element or the cover element, the side connecting between two adjacent corners. The first extending protrusion is formed to protrude to an outside from the second extending protrusion. The first extending protrusion includes a first enlarged extending protrusion, which the protrusion portion is formed on and the clearance is formed in, and a second enlarged extending protrusion, which extends and protrudes to an outside without the protrusion portion being formed. Thus, the effect for restricting the liquid from penetrating to the inside of the accommodation element via the corner is effectively improved.

Alternatively, the electric control device may further include: a connector facing the side of the outer periphery of the accommodation element or the cover element. The first enlarged extending protrusion is formed at two corners among four corners of the accommodation element or the cover element, the two corners which are spaced apart from the connector. The second enlarged extending protrusion is formed at other two corners among four corners of the accommodation element or the cover element, the other two corners which are disposed near the connector. In the above structure, since the protrusion portion is not formed on the second enlarged extending protrusion, the protrusion portion is protected from being interrupted by a harness when the connector is connected to the harness, for example. Thus, workability near the connector is improved in the present invention.

Alternatively, the second enlarged extending protrusion may be formed such that an end of the second enlarged extending protrusion on the connector side is overlapped with the connector. Thus, the liquid is restricted from penetrating into the accommodation element between the second enlarged extending protrusion and the connector.

Alternatively, the first enlarged extending protrusion may protrude to an outside from the second enlarged extending protrusion. Thus, the liquid is effectively restricted from penetrating into the accommodation element via the outer periphery, specifically, the corner of the accommodation element and the cover element.

Alternatively, the cover element or the accommodation element may include a separation member formed on a surface opposite to the accommodation space in such a manner that liquid on a liquid drop area flows to avoid the connection portion, the liquid drop area on which it is estimated that liquid drops.

The clearance between the cover element and the accommodation element may be easily formed near the connection portion. In the present invention, the liquid dropped on the liquid drop area flows to avoid the connection portion. Accordingly, the liquid is restricted from penetrating in the inside of the electric control device via the clearance near the connection portion between the cover element and the accommodation element.

Alternatively, the separation member may include a flowing passage formation portion, which protrudes to a direction perpendicular to a surface, on which the liquid drop area is formed. The flowing passage formation portion is formed between the liquid drop area and the connection portion. One end of the flowing passage formation portion is formed to be disposed on an upstream side in a liquid flowing direction of the other end. Thus, the liquid drop area and the connection portion are separated by the flowing passage formation portion, so that the liquid dropped on the liquid drop area is restricted from penetrating to the inside of the electric control device via the clearance near the connection portion.

Alternatively, the separation member may include a special separation member formed to be along with an outline of the connection portion. Further, the special separation member may be a separation wall formed to be apart from the connection portion by a predetermined distance. Alternatively, the special separation member may be a separation board or a separation groove. The above structures provide to restrict the liquid dropped on the liquid drop area from penetrating to the inside of the electric control device via the clearance near the connection portion.

Alternatively, a separation periphery wall may be formed on the bottom or a surface of the cover element opposite to the accommodation space. The separation periphery wall protrudes along with a periphery toward a direction opposite to the accommodation space. Thus, the liquid is restricted from penetrating to the inside of the electric control device via the clearance between the cover element and the accommodation element.

Alternatively, the separation periphery wall may include a plurality of drain trenches. Here, it is preferred that each drain trench is formed at a predetermined position. The predetermined position may be a position covering the clearance between the cover element and the accommodation element, a position at which the liquid discharged from the drain trench does not affect other elements, and the like. Thus, since the liquid flows along with the drain trench formed at the predetermined position, the liquid is restricted from penetrating to the inside of the electric control device. Further, the liquid is restricted from affecting other elements.

Alternatively, the cover element may include an engagement member, which engages with the accommodation element and is disposed on a surface opposite to the surface, on which the liquid drop area is formed. The engagement member is formed to have a taper shape so as to introduce liquid to a predetermined area in the accommodation space when the liquid penetrates into the accommodation space. Here, the predetermined area is an area, on which no electric element is arranged. For example, it is considered that the predetermined area is a screw assembling member. Thus, even if the liquid penetrates to the inside of the electric control device, the liquid is introduced to the area, on which no electric element is arranged, by the engagement member having an introduction shape. Thus, the electric element is protected from wetting with water.

Alternatively, the electric element may be arranged on the substrate so that the control element is formed. The engagement member includes an outer wall, which is formed at a position nearer the inner wall of the accommodation element than the periphery of the substrate. Here, the side inner wall surface of the accommodation element and the outer wall of the engagement member may be adjacent to each other. Alternatively, they may have a clearance therebetween so that the liquid easily flows from the outer wall of the engagement member to the side inner wall surface of the accommodation element by surface tension. Alternatively, the side inner wall surface of the accommodation element may be in parallel to the outer wall of the engagement member. Thus, the liquid on the outer wall of the engagement member easily flows to the side inner wall surface of the accommodation element. Thus, even if the liquid penetrates to the inside of the electric control device, the liquid can be introduced to flow along with the inner wall of the accommodation element. Thus, the liquid is restricted from adhering the substrate.

Alternatively, one end of the engagement member on the substrate side may include a convexity, which is formed at a position nearer the inner wall of the accommodation element than the periphery of the substrate. Thus, even if the liquid penetrates to the inside of the electric control device, the liquid is restricted from crossing over the engagement member and reaching the substrate. Thus, the liquid is restricted from adhering the substrate.

Alternatively, the accommodation element may include at least one concavity and one convexity on the inner wall near the engagement member of the cover element. Thus, the clearance between the side inner wall surface of the accommodation element and the end of the engagement element on the substrate side is reduced. Even if the liquid penetrates to the inside of the electric control device, the liquid flows along with the side inner wall surface of the accommodation element. Further, the liquid is not introduced to the substrate side by the surface tension, so that the liquid flows along with the inner wall of the accommodation element. Accordingly, the liquid is restricted from adhering the substrate.

Alternatively, the substrate may include a notch concavity disposed at a position of the periphery corresponding to the connection portion. The engagement member includes a liquid drop introduction member on both sides of a position of the engagement member corresponding to the hook. A projection of the liquid drop introduction member in a vertical direction is disposed on an outside, along a horizontal direction, of a projection of the substrate having the notch concavity in the vertical direction. Thus, even if the liquid penetrates to the inside of the electric control device, the liquid is restricted from dropping on the substrate since the liquid penetrated into the electric control device passes through concavity space formed at the notch concavity of the substrate along with the liquid drop introduction member or drops to the outside of the substrate.

While example embodiments have been described above, it is to be understood that the invention is not limited to the example embodiments and constructions. The invention is intended to cover various modification and equivalent arrangements. In addition, while the various combinations and configurations, which are exemplary, other combinations and configurations, including more, less or only a single element, are also within the spirit and scope of the invention.

The invention claimed is:

1. An electric control device comprising:
an accommodation element as a casing having an opening and a bottom;
a cover element for covering the opening of the accommodation element so that an accommodation space is formed between the cover element and the accommodation element;
a connection element for fixing the cover element to the accommodation element;
an extending protrusion formed on the cover element or the accommodation element in such a manner that the extending protrusion extends and protrudes to an outside from a contact portion between the cover element and a periphery around the opening; and
a control element formed in the accommodation space,
wherein the extending protrusion includes a protrusion portion, which extends from an outer periphery of the accommodation element or the cover element, and which protrudes toward a bottom side or a cover element side and is formed to cover the contact portion,
wherein a clearance having a predetermined dimension is formed between the protrusion portion and one of an outer wall of the cover element and an outer wall of the accommodation element, which is near the contact portion,
wherein the accommodation element and the cover element are formed to have a rectangular shape,
wherein the extending protrusion includes a first extending protrusion formed to face a corner of an outer periphery of the accommodation element or the cover element and a second extending protrusion formed to face a side of the outer periphery of the accommodation element or the cover element, the side connecting between two adjacent corners, and
wherein the first extending protrusion is formed to protrude to an outside from the second extending protrusion, such that a protrusion amount of the first extending protrusion is larger than the second extending protrusion.

2. The electric control device according to claim 1,
wherein the clearance is formed to face at least one corner among four corners of the accommodation element or the cover element.

3. The electric control device according to claim 2
wherein the protrusion portion is formed to bend along with an outer periphery of the corner so as to cover the corner.

4. The electric control device according to claim 1,
wherein the first extending protrusion includes a first enlarged extending protrusion, which the protrusion portion is formed on and the clearance is formed in, and a second enlarged extending protrusion, which extends and protrudes to an outside without the protrusion portion being formed.

5. The electric control device according to claim 4, further comprising:
a connector facing the side of the outer periphery of the accommodation element or the cover element,
wherein the first enlarged extending protrusion is formed at two corners among four corners of the accommodation element or the cover element, the two corners which are spaced apart from the connector, and
wherein the second enlarged extending protrusion is formed at other two corners among four corners of the accommodation element or the cover element, the other two corners which are disposed near the connector.

6. The electric control device according to claim 5, wherein the second enlarged extending protrusion is formed such that an end of the second enlarged extending protrusion on the connector side is overlapped with the connector.

7. The electric control device according to claim 4, wherein the first enlarged extending protrusion protrudes to an outside relative to the second enlarged extending protrusion.

\* \* \* \* \*